United States Patent [19]

Ueda

[11] Patent Number: 4,713,602
[45] Date of Patent: Dec. 15, 1987

[54] CIRCUIT RESISTANCE ADJUSTING DEVICE

[75] Inventor: Kenji Ueda, Ohtsu, Japan

[73] Assignee: Omron Tateisi Electronics Co., Kyoto, Japan

[21] Appl. No.: 839,718

[22] Filed: Mar. 14, 1986

[30] Foreign Application Priority Data

Mar. 14, 1985 [JP] Japan .................................. 60-52105

[51] Int. Cl.⁴ ............................................. G05B 24/02
[52] U.S. Cl. ................................... 323/354; 323/233; 323/369
[58] Field of Search ............... 323/233, 297, 354, 364, 323/369

[56] References Cited

U.S. PATENT DOCUMENTS

| | | | |
|---|---|---|---|
| 4,016,483 | 4/1977 | Rudin | 323/354 |
| 4,412,241 | 10/1983 | Nelson | 323/354 |
| 4,414,501 | 11/1983 | Bedard et al. | 323/354 |
| 4,484,295 | 11/1984 | Bedard et al. | 323/354 |

*Primary Examiner*—Peter S. Wong
*Assistant Examiner*—Jeffrey Sterrett
*Attorney, Agent, or Firm*—Schwartz, Jeffery, Schwaab, Mack, Blumenthal & Evans

[57] ABSTRACT

A circuit resistance adjusting device for producing a combined resistance consisting of a plurality of resistances which are selectively connected by a switching member. The switching member includes a plurality of switching elements and fuses which are respectively connected with the resistances, wherein when a hold signal is applied to the switching member, the fuses are adapted be fused off. A patterning member sequentially generates a predetermined pattern signal to the switching member on a step-by-step basis when a signal is applied to the patterning member, so that the resistances are respectively connected sequentially. Thus, upon the application of the hold signal, the patterning member is held to generate a pattern signal and the connection of the resistances is fixed by the fused-off of the fuses.

4 Claims, 2 Drawing Figures

CIRCUIT RESISTANCE ADJUSTING DEVICE

BRIEF SUMMARY OF THE INVENTION

This invention relates to a circuit resistance adjusting device for adjusting a resistance within a circuit to define a sensitivity of the circuit, and more particularly to an improved device capable of adjusting the resistance to a predetermined resistance in accordance with an external signal.

In conventional electronic switches such as proximity or photo-electric switches, ultrasonic switches or the like, there are irregular characteristics of detecting elements or irregular mounting positions of parts whereby adjustable resistors are mounted in circuit devices of the switches for adjusting the sensitivities of the circuit devices to predetermined values. The conventional adjustable resistors have been proposed to be represented by several methods. One proposed method is to manually or mechanically adjust a semi-fixed resistor mounted on a part of a circuitry, resulting in that the resistor takes a large mounting space due to the construction thereof and its mounting is restricted and takes long time due to the necessity of its mechanical adjustment. Another proposed method is that an external variable resistor is connected with adjusting terminals tapping a part of the circuitry for its manual or mechanical adjustment and that the manually or mechanically adjusted variable resistor is replaced by a fixed-resistor having the same resistance value as the value read from the adjusted variable resistor to be mounted on the part of the circuitry. The method for replacing with the fixed-resistor takes time for the replacement and the adjustment, and decreases the freedom of its assembling work due to the necessity of replacement of the mounted fixed-resistor. Another proposed method is such that a printed resistor for adjustment is formed on a circuit board and trimmed by laser to perform a predetermined operation. This laser function trimming method, however, fairly decreases the assembling freedom because the printed resistor must be disposed at a position impinged by laser, and requires the higher size and mounting accuracies about its peripheral components than the ordinally required degree because the mounting accuracy of the printed resistor must be fairly high for the laser trimming operation.

In accordance with this invention there is provided a circuit resistance adjusting device comprising resistance means including a plurality of resistances, switching means coupled with the resistance unit means for selectively connecting the plurality of resistances to produce a combined resistance, patterning means connected with the switching means for receiving a first signal to allow the switching means to selectively connect the plurality of resistances on a step-by-step basis in accordance with a predetermined pattern, and holding means for receiving a second signal to hold the patterning means and fix the connection of the plurality of resistances so that the combined resistance be fixed.

A primary object of this invention is therefore to provide a circuit resistance adjusting device which overcomes the above-mentioned disadvantages and is capable of automatically adjusting a resistance in a circuit.

Other objects and advantages of this invention will become apparent from the following description taken in conjunction with the accompanying drawings in which:

DETAILED DESCRIPTION

Figure 1:
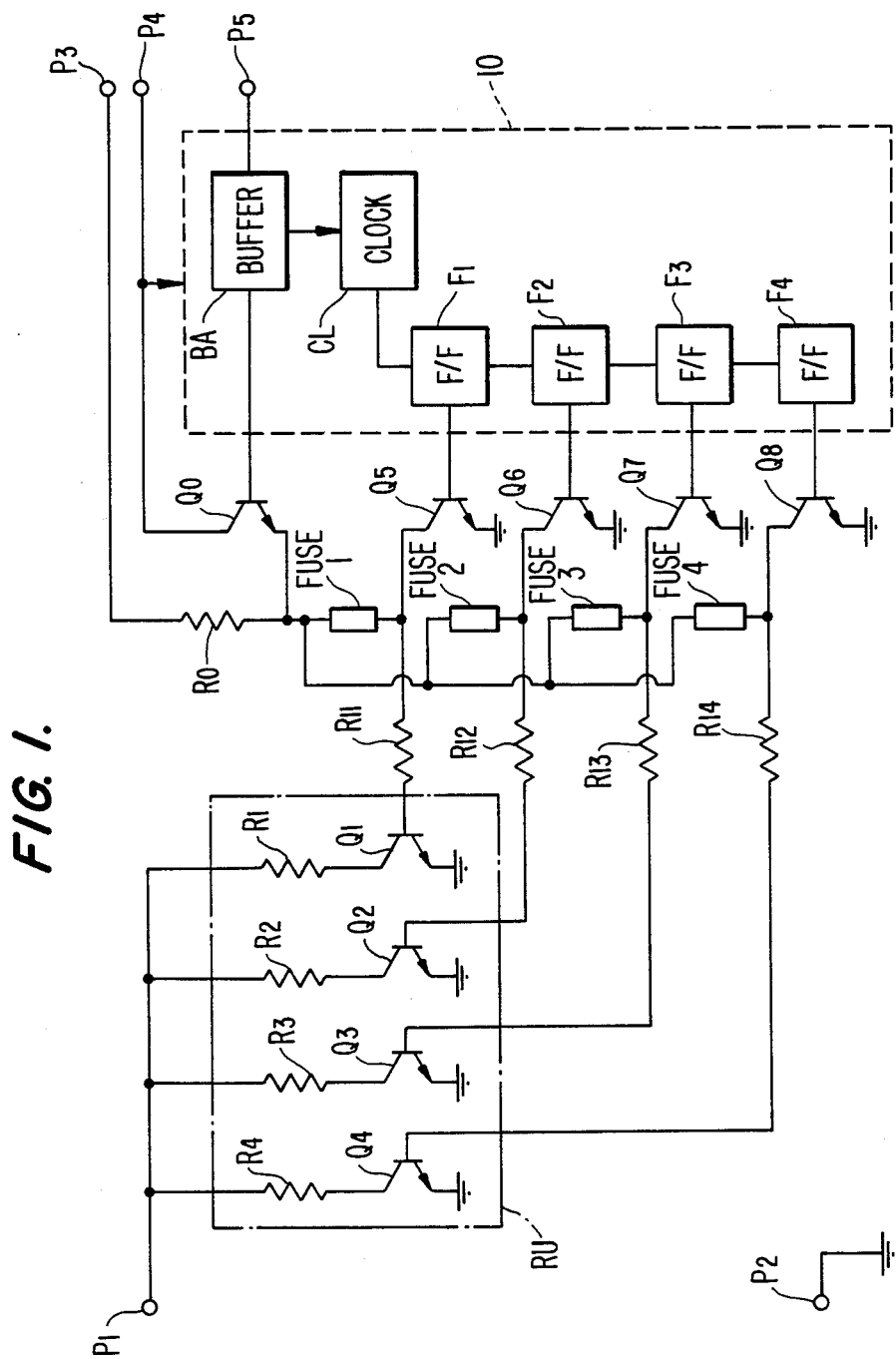
FIG. 1 is a schematic circuit block diagram showing a circuit resistance adjusting device as a preferred embodiment of this invention.

A circuit block diagram of a circuit resistance adjusting device in accordance with one embodiment of this invention is illustrated in FIG. 1.

Resistors $R_1$ through $R_4$ disposed for resistance adjustment are at their ends commonly connected to a terminal $P_1$ and at their opposite ends connected with the respective collectors of switching transistors $Q_1$ through $Q_4$ having their emitters grounded so that in accordance with on-or-off status of the transistors $Q_1$ through $Q_4$ the resistors $R_1$ through $R_4$ be selectively connected in parallel with respect to terminals $P_1$ and $P_2$.

Microfuses 1, 2, 3 and 4 made of nichrome have their one ends connected with collectors of transistors $Q_5$, $Q_6$, $Q_7$ and $Q_8$ and through resistors $R_{11}$, $R_{12}$, $R_{13}$ and $R_{14}$ with the bases of transistors $Q_1$, $Q_2$, $Q_3$ and $Q_4$, respectively. The opposite ends of the microfuses 1 through 4 are commonly connected with terminal $P_3$ through resistor $R_0$ and with transistor $Q_0$ at its emitter. The transistors $Q_1$ through $Q_4$ are of NPN type, so that upon the application of a positive potential to the terminal $P_3$ a bias current is supplied to the transistors $Q_1$ through $Q_4$ via the respective fuses to turn on the same. Thus, switching means is constituted with fuses 1 through 4 and transistors $Q_1$ through $Q_4$, and the resistors $R_1$ through $R_4$ may be selectively connected by selectively fusing the fuses.

A terminal $P_4$ is connected with a point of a logic circuit 10 for supplying power to the circuit as a first signal, and further connected to the NPN transistor $Q_0$. Upon the application of a positive potential to the terminal $P_4$, a source voltage is applied to a buffer circuit BA, a clock circuit CL and flip-flop (briefly described as "F/F" hereinafter) circuits $F_1$, $F_2$, $F_3$ and $F_4$ to start the clock circuit CL whose pulse output is sequentially applied to F/F circuits $F_1$, $F_2$, $F_3$ and $F_4$. The respective outputs produced from F/F circuits are applied to the bases of NPN transistors $Q_5$ through $Q_8$ for turning on or off the same which are grounded through their emitters.

Upon the application of a signal potential or a second signal to the buffer circuit BA via a terminal $P_5$, the circuit BA generates an operation stop signal for application to the clock circuit CL and another output to transistor $Q_0$ for turning on the same.

Operation of the above-embodied device will be described hereinafter.

When a potential signal is applied to the terminal $P_3$, a base biassing current is applied through resistor $R_0$ and fuses 1, 2, 3 and 4 to transistors $Q_1$, $Q_2$, $Q_3$ and $Q_4$ to turn on the same, so that resistors $R_1$, $R_2$, $R_3$ and $R_4$ are connected in parallel with each other across terminals $P_1$ and $P_2$. Then, as a potential is applied to the terminal $P_4$, the clock circuit CL is initiated to sequentially apply a pulse signal to F/F circuits $F_1$ through $F_4$ whose outputs selectively turn on or off the transistors $Q_5$ through $Q_8$. The turned-on transistor bypasses the current of the corresponding one of the transistors $Q_1$ through $Q_4$ to turn off the same. Thus, the combination of resistors $R_1$, $R_2$, $R_3$ and $R_4$ connected in parallel across terminals $P_1$ and $P_2$ is changed by each clock pulse generated from clock circuit CL whereby a patterning operation is performed.

When an electronic switch is connected across the terminals $P_1$ and $P_2$, the resistance circuit RU has turned to a resistance value and a main circuit of the electronic switch performs a predetermined operation to apply a potential signal to the terminal $P_5$, the clock circuit CL stops and F/F circuits $F_1$ through $F_4$ retain their stages. Simultaneously the transistor $Q_0$ through the buffer circuit BA is turned on and the potential applied to the terminal $P_3$ is grounded by the turned-on transistors among $Q_5$ through $Q_8$ through their corresponding fuses so as to fuse the same.

As the potential signal applied to the terminal $P_4$ is removed, the all components of transistor $Q_0$, buffer circuit BA, clock circuit CL and F/F circuits stop their functions, whereby all of the transistors $Q_5$ through $Q_8$ and $Q_0$ are turned off. Since the fuse connected with the transistor ($Q_5 \ldots Q_8$) turned on on the last step of the logical operation in the logic circuit 10 is fused-off, however, the transistor ($Q_1 \ldots Q_4$) connected with the fused-off fuse is not supplied with any base current even when all of the transistors $Q_5$ through $Q_8$ are turned off. Meanwhile the transistor connected through the resistor with the fuse which was not fused off on the last logical operation is provided with its base current. Thus, the parallel connection of the resistors $R_1$ through $R_4$ is fixed to the connection which was formed on the predetermined operation of the main circuit. There are made 16 ($=2^4$) combinations of the parallel connection by employing four resistors $R_1$ through $R_4$ in this embodiment. If "n" pieces of resistors are employed, nth power of 2 combinations are available. The above-mentioned NPN transistors may be replaced with other active elements, if desired.

Figure 2:
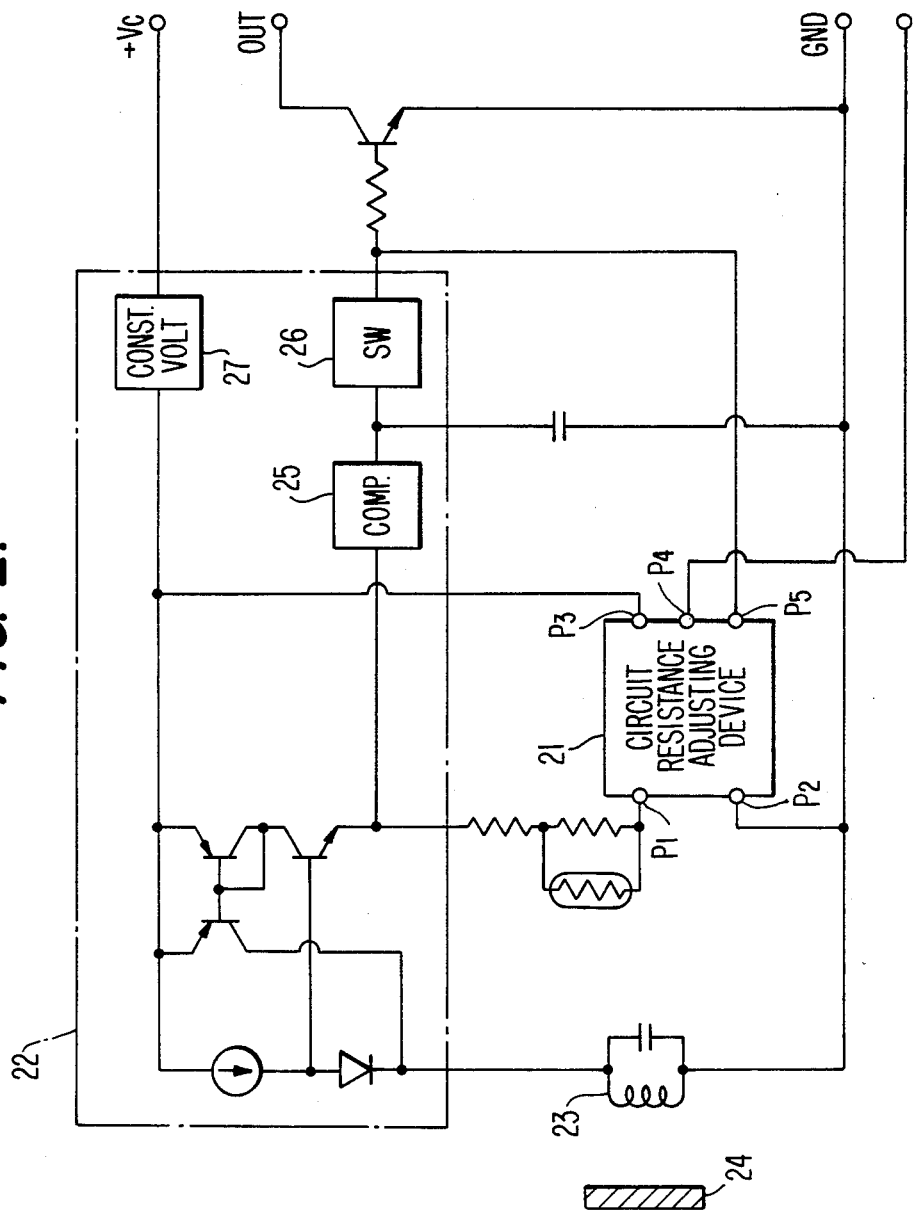
FIG. 2 is a schematic circuit block diagram showing a proximity switch employing the device.

Returning to FIG. 2, there is shown a block diagram of a proximity switch employing the circuit resistance adjusting device 21 having terminals $P_1$ through $P_5$ of FIG. 1. The proximity switch includes a main circuit 22 formed on an IC chip and a detection coil 23. The circuit 22 includes a constant voltage regulation circuit 27, comparator 25 and switching circuit 26.

The object 24 to be detected by the detection coil 23 is arranged at predetermined intervals from the detection coil 23. The proximity switch is designed to oscillate stronger as its adjusting resistance developed between terminals $P_1$ and $P_2$ of the circuit resistance adjusting circuit 21 becomes smaller or weaker for oscillation stop as it becomes larger.

As a potential signal is applied to the terminal $P_4$, the combined resistance developed between the terminals $P_1$ and $P_2$ of the circuit 21 becomes gradually larger for each clock pulse because "n" pieces of resistances are intitially connected in a parallel relationship but some of them is disconnected by selection. When the combined resistance increases to a certain extent, the oscillation stops and an operation signal is generated from a switch circuit 26 within the main circuit 22 for application to the terminal $P_5$, so that the clock circuit within the device 21 is deactivated and the microfuses are selectively fused off. Thus, resistance adjustment operation is finished. Then, if the potential signal is removed, the adjustment operation is deactivated.

Thus, according to the circuit resistance adjusting device of this embodiment, all operations for adjusting the sensitivity of the proximity switch or a resistance therewithin are automatically performed without any manual nor mechanical adjusting operation and the time for the adjustment is fairly reduced. Moreover, any particular adjustment tool is not required for perfect adjustment operation with high accuracy. The operation for changing the parallel connection of the resistors is also easy. Since this circuit resistance adjusting device may be formed on an IC circuit together with the main circuit of the proximity switch, its assembling work is not restricted and the components can be miniaturized. The circuit resistance adjusting device may be employed in other electronic switch or any other circuit device in which a circuit resistance is necessary.

Though the resistances ($R_1$ to $R_4$) are connected in parallel in the foregoing embodiment, the resistance unit (RU) may be modified such that the resistances are connected in a serial relationship by connecting each transistor ($Q_1$ to $Q_4$) across the resistance. The fuses also may be represented by other equivalent switching elements, such transistors or the like. While one embodiment of this invention has been described in detail herein and shown in the accompanying drawings, it will be evident that various further modifications are possible without departing from the scope of this invention.

What is claimed is:

1. A circuit resistance adjusting device comprising resistance means including a plurality of resistances, switching means coupled with said resistance unit means for selectively connecting said plurality of resistances to produce a combined resistance, patterning means connected with said switching means for receiving a first signal for controlling said switching means to selectively and sequentially connect said plurality of resistances in accordance with a predetermined pattern, and holding means for receiving a second signal to hold said patterning means and fix the connection of said plurality of resistances so that said combined resistance is permanently fixed.

2. A circuit resistance adjusting device according to claim 1 in which said switching means includes a plurality of switching elements which respectively correspond to said plurality of resistances.

3. A circuit resistance adjusting device according to claim 2 in which said switching means includes a plurality of fuses respectively connected to said plurality of switching elements and said fuses are adapted to be selectively fused off upon the application of said second signal to said holding means.

4. A circuit resistance adjusting device according to claim 2 in which one of the ends of said resistances are respectively grounded through said switching elements and the opposite ends thereof are commonly connected.

* * * * *